(12) United States Patent
Youn et al.

(10) Patent No.: US 7,095,785 B2
(45) Date of Patent: Aug. 22, 2006

(54) DETERMINATION OF PREDICTION DIRECTION IN MPEG-4

(75) Inventors: Jeongnam Youn, San Jose, CA (US); Chris Basoglu, Everett, WA (US)

(73) Assignee: Equator Technologies, Inc., Campbell, CA (US)

( * ) Notice: Subject to any disclaimer, the term of this patent is extended or adjusted under 35 U.S.C. 154(b) by 412 days.

(21) Appl. No.: 10/187,255

(22) Filed: Jun. 28, 2002

(65) Prior Publication Data

US 2003/0031256 A1     Feb. 13, 2003

Related U.S. Application Data

(60) Provisional application No. 60/301,866, filed on Jun. 29, 2001.

(51) Int. Cl.
*H04B 1/66* (2006.01)
(52) U.S. Cl. .................................. 375/240.12
(58) Field of Classification Search ............... 375/240.12–240.29; 382/232, 236, 250, 238; 341/50; H04B 1/66
See application file for complete search history.

(56) References Cited

U.S. PATENT DOCUMENTS

| | | | | |
|---|---|---|---|---|
| 5,974,184 A | * | 10/1999 | Eifrig et al. | 382/236 |
| 5,991,453 A | * | 11/1999 | Kweon et al. | 382/250 |
| 6,148,109 A | * | 11/2000 | Boon et al. | 382/238 |
| 6,341,144 B1 | * | 1/2002 | Haskell et al. | 375/240.2 |
| 6,362,753 B1 | * | 3/2002 | Kasahara | 341/50 |
| 6,466,620 B1 | * | 10/2002 | Lee | 375/240.03 |
| 6,532,306 B1 | * | 3/2003 | Boon et al. | 382/232 |
| 2002/0044601 A1 | * | 4/2002 | Haskell et al. | 375/240.2 |

\* cited by examiner

*Primary Examiner*—Tung Vo
(74) *Attorney, Agent, or Firm*—Marger Johnson & McCollom P.C.

(57) ABSTRACT

By noting the types (I or P) of macro blocks used for DC and/or AC prediction, one can determine the prediction direction without calculating the prediction-direction equation defined by the MPEG-4 standard.

9 Claims, 11 Drawing Sheets

VERTICAL PREDICTION IN X

Y-DCT (00)a . . . . . . . . . Y-DCT (07)a
.  .  .  .  .  .  .
.
.
.
.
.
Y-DCT (70)a . . . . . . . . . Y-DCT (77)a

Y-IDCT (00)a . . . . . . . . . . Y-IDCT (07)a

Y-IDCT (70)a . . . . . . . . . . Y-IDCT (77)a

FIG. 7 (PRIOR ART)

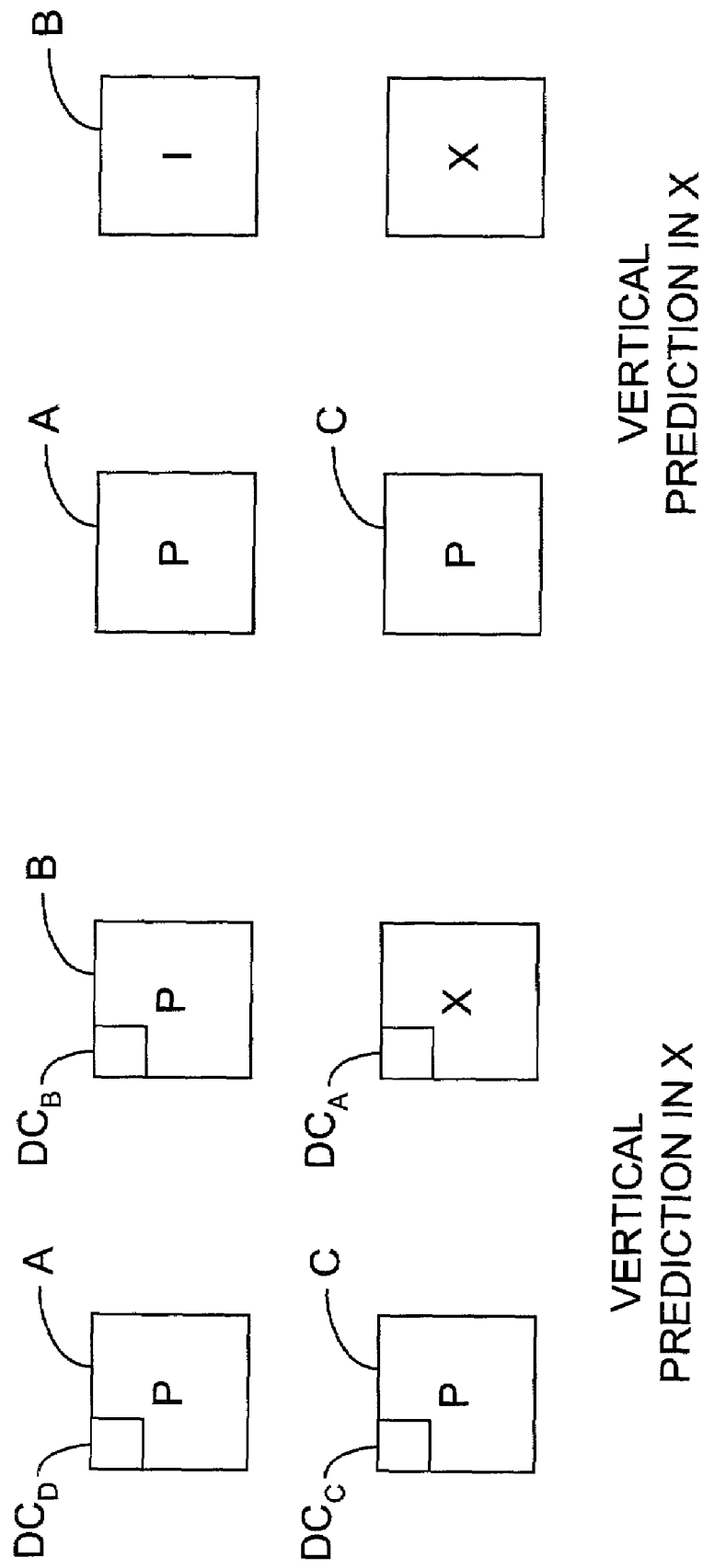

DETERMINATION OF PREDICTION DIRECTION IN MPEG-4

RELATED APPLICATIONS

This application makes reference to claims the benefit of U.S. Provisional Patent Application Ser. No. 60/301,866 filed on Jun. 29, 2001 is incorporated herein by reference in their entirety.

TECHNICAL FIELD OF THE INVENTION

The following embodiments of the invention are for use with images encoded/decoded according to the MPEG standard, particularly the MPEG-4 standard.

BACKGROUND

General Overview

To help the reader more easily understand the concepts discussed below in the description of the invention, following is a basic overview of conventional image-compression techniques.

To electronically transmit a relatively high-resolution image over a relatively low-band-width channel, or to electronically store such an image in a relatively small memory space, it is often necessary to compress the digital data that represents the image. Such image compression typically involves reducing the number of data bits necessary to represent an image. For example, High-Definition-Television (HDTV) video images are compressed to allow their transmission over existing television channels. Without compression, HDTV video images would require transmission channels having bandwidths much greater than the bandwidths of existing television channels. Furthermore, to reduce data traffic and transmission time to acceptable levels, an image may be compressed before being sent over the internet. Or, to increase the image-storage capacity of a CD-ROM or server, an image may be compressed before being stored thereon.

Referring to FIGS. 1A–7, the basics of the popular block-based Moving Pictures Experts Group (MPEG) compression standards, which include MPEG-1, MPEG-2, and MPEG-4 are discussed. For purposes of illustration, the discussion is based on using an MPEG 4:2:0 format to compress video images represented in a Y, $C_B$, $C_R$ color space. However, the discussed concepts also apply to other MPEG formats, to images that are represented in other color spaces, and to other block-based compression standards such as the Joint Photographic Experts Group (JPEG) standard, which is often used to compress still images. Furthermore, although many details of the MPEG standards and the Y, $C_B$, $C_R$ color space are omitted for brevity, these details are well known and are disclosed in a large number of available references.

Still referring to FIGS. 1A–7, the MPEG standards are often used to compress temporal sequences of images—video frames for purposes of this discussion—such as those found in a television broadcast. Each video frame is divided into subregions called macro blocks, which each include one or more pixels. FIG. 1A is a 16-pixel-by-16-pixel macro block 30 having 256 pixels 32 (not drawn to scale). In the MPEG standards, a macro block is typically 16×16 pixels, although other compression standards may use macro blocks having other dimensions. In the original video frame, i.e., the frame before compression, each pixel 32 has a respective luminance value Y and a respective pair of color-, i.e., chroma-, difference values $C_B$ and $C_R$.

Referring to FIGS. 1A–1D, before compression of the frame, the digital luminance (Y) and chroma-difference ($C_B$ and $C_R$) values that will be used for compression, i.e., the pre-compression values, are generated from the original Y, $C_B$, and $C_R$ values of the original frame. In the MPEG 4:2:0 format, the pre-compression Y values are the same as the original Y values. Thus, each pixel 32 merely retains its original luminance value Y. But to reduce the amount of data to be compressed, the MPEG 4:2:0 format allows only one pre-compression $C_B$ value and one pre-compression $C_R$ value for each group 34 of four pixels 32. Each of these pre-compression $C_B$ and $C_R$ values are respectively derived from the original $C_B$ and $C_R$ values of the four pixels 32 in the respective group 34. For example, a pre-compression $C_B$ value may equal the average of the original $C_B$ values of the four pixels 32 in the respective group 34. Thus, referring to FIGS. 1B–1D, the pre-compression Y, $C_B$, and $C_R$ values generated for a macro block are arranged as one 16×16 matrix 36 of pre-compression Y values (equal to the original Y values for each respective pixel 32), one 8×8 matrix 38 of pre-compression $C_B$ values (equal to one derived $C_B$ value for each group 34 of four pixels 32), and one 8×8 matrix 40 of pre-compression $C_R$ values (equal to one derived $C_R$ value for each group 34 of four pixels 32). The matrices 36, 38, and 40 are often called "blocks" of values. Furthermore, because it is convenient to perform the compression transforms on 8×8 blocks of pixel values instead of on 16×16 blocks, the block 36 of pre-compression Y values is subdivided into four 8×8 blocks 42a–42d, which respectively correspond to the 8×8 blocks A–D of pixels in the macro block 30. Thus, referring to FIGS. 1A–1D, six 8×8 blocks of pre-compression pixel data are generated for each macro block 30: four 8×8 blocks 42a–42d of pre-compression Y values, one 8×8 block 38 of pre-compression $C_B$ values, and one 8×8 block 40 of pre-compression $C_R$ values.

FIG. 2 is a block diagram of an MPEG compressor 50, which is more commonly called an encoder. Generally, the encoder 50 converts the pre-compression data for a frame or sequence of frames into encoded data that represent the same frame or frames with significantly fewer data bits than the pre-compression data. To perform this conversion, the encoder 50 reduces or eliminates redundancies in the pre-compression data and reformats the remaining data using efficient transform and coding techniques.

More specifically, the encoder 50 includes a frame-reorder buffer 52, which receives the pre-compression data for a sequence of one or more frames and reorders the frames in an appropriate sequence for encoding. Thus, the reordered sequence is often different than the sequence in which the frames are generated and will be displayed. The encoder 50 assigns each of the stored frames to a respective group, called a Group Of Pictures (GOP), and labels each frame as either an intra (I) frame or a non-intra (non-I) frame. For example, each GOP may include three I frames and twelve non-I frames for a total of fifteen frames. The encoder 50 always encodes an I frame without reference to another frame, but can and often does encode a non-I frame with reference to one or more of the other frames in the GOP. The encoder 50 does not, however, encode a non-I frame with reference to a frame in a different GOP.

Referring to FIGS. 2 and 3, during the encoding of an I frame, the 8×8 blocks (FIGS. 1B–1D) of the pre-compression Y, $C_B$, and $C_R$ values that represent the I frame pass through a summer 54 to a Discrete Cosine Transformer (DCT) 56, which transforms these blocks of values into respective 8×8 blocks of one DC (zero frequency) transform value and sixty-three AC (non-zero frequency) transform values. FIG. 3 is a block 57 of luminance transform values Y-DCT$_{(0, 0)a}$–Y-DCT$_{(7, 7)a}$, which correspond to the pre-compression luminance pixel values Y$_{(0, 0)a}$–Y$_{(7, 7)a}$ in the block 36 of FIG. 1B. Thus, the block 57 has the same number of luminance transform values Y-DCT as the block 36 has of luminance pixel values Y. Likewise, blocks of chroma transform values C$_B$-DCT and C$_R$-DCT (not shown) correspond to the chroma pixel values in the blocks 38 and 40. Furthermore, the pre-compression Y, C$_B$, and C$_R$ values pass through the summer 54 without being summed with any other values because the summer 54 is not needed when the encoder 50 encodes an I frame. As discussed below, however, the summer 54 is often needed when the encoder 50 encodes a non-I frame.

Referring to FIG. 2 and FIG. 4, a quantizer and zigzag scanner 58 limits each of the transform values from the DCT 56 to a respective maximum value, and provides the quantized AC and DC transform values on respective paths 60 and 62. FIG. 4 is an example of a zigzag scan pattern 63, which the quantizer and zigzag scanner 58 may implement. Specifically, the quantizer and scanner 58 reads the transform values in the transform block (such as the transform block 57 of FIG. 3) in the order indicated. Thus, the quantizer and scanner 58 reads the transform value in the "0" position first, the transform value in the "1" position second, the transform value in the "2" position third, and so on until it reads the transform value in the "63" position last. The quantizer and zigzag scanner 58 reads the transform values in this zigzag pattern to increase the coding efficiency as is known. Of course, depending upon the coding technique and the type of images being encoded, the quantizer and zigzag scanner 58 may implement other scan patterns too.

Referring again to FIG. 2, a prediction encoder 64 predictively encodes the DC transform values, and a variable-length coder 66 converts the quantized AC transform values and the quantized and predictively encoded DC transform values into variable-length codes such as Huffman codes. These codes form the encoded data that represent the pixel values of the encoded I frame. A transmit buffer 68 then temporarily stores these codes to allow synchronized transmission of the encoded data to a decoder (discussed below in conjunction with FIG. 6). Alternatively, if the encoded data is to be stored instead of transmitted, the coder 66 may provide the variable-length codes directly to a storage medium such as a CD-ROM.

If the I frame will be used as a reference (as it often will be) for one or more non-I frames in the GOP, then, for the following reasons, the encoder 50 generates a corresponding reference frame by decoding the encoded I frame with a decoding technique that is similar or identical to the decoding technique used by the decoder (FIG. 6). When decoding non-I frames that are referenced to the I frame, the decoder has no option but to use the decoded I frame as a reference frame. Because MPEG encoding and decoding are lossy—some information is lost due to quantization of the AC and DC transform values—the pixel values of the decoded I frame will often be different than the pre-compression pixel values of the original I frame. Therefore, using the pre-compression I frame as a reference frame during encoding may cause additional artifacts in the decoded non-I frame because the reference frame used for decoding (decoded I frame) would be different than the reference frame used for encoding (pre-compression I frame).

Therefore, to generate a reference frame for the encoder that will be similar to or the same as the reference frame for the decoder, the encoder 50 includes a dequantizer and inverse zigzag scanner 70, and an inverse DCT 72, which are designed to mimic the dequantizer and scanner and the inverse DCT of the decoder (FIG. 6). The dequantizer and inverse scanner 70 first implements an inverse of the zigzag scan path implemented by the quantizer 58 such that the DCT values are properly located within respective decoded transform blocks. Next, the dequantizer and inverse scanner 70 dequantizes the quantized DCT values, and the inverse DCT 72 transforms these dequantized DCT values into corresponding 8×8 blocks of decoded Y, C$_B$, and C$_R$ pixel values, which together compose the reference frame. Because of the losses incurred during quantization, however, some or all of these decoded pixel values may be different than their corresponding pre-compression pixel values, and thus the reference frame may be different than its corresponding pre-compression frame as discussed above. The decoded pixel values then pass through a summer 74 (used when generating a reference frame from a non-I frame as discussed below) to a reference-frame buffer 76, which stores the reference frame.

During the encoding of a non-I frame, the encoder 50 initially encodes each macro-block of the non-I frame in at least two ways: in the manner discussed above for I frames, and using motion prediction, which is discussed below. The encoder 50 then saves and transmits the resulting code having the fewest bits. This technique insures that the macro blocks of the non-I frames are encoded using the fewest bits.

With respect to motion prediction, an object in a frame exhibits motion if its relative position changes in the preceding or succeeding frames. For example, a horse exhibits relative motion if it gallops across the screen. Or, if the camera follows the horse, then the background exhibits relative motion with respect to the horse. Generally, each of the succeeding frames in which the object appears contains at least some of the same macro blocks of pixels as the preceding frames. But such matching macro blocks in a succeeding frame often occupy respective frame locations that are different than the respective frame locations they occupy in the preceding frames. Alternatively, a macro block that includes a portion of a stationary object (e.g., tree) or background scene (e.g., sky) may occupy the same frame location in each of a succession of frames, and thus exhibit "zero motion". In either case, instead of encoding each frame independently, it often takes fewer data bits to tell the decoder "the macro blocks R and Z of frame 1 (non-I frame) are the same as the macro blocks that are in the locations S and T, respectively, of frame 0 (reference frame)." This "statement" is encoded as a motion vector. For a relatively fast moving object, the location values of the motion vectors are relatively large. Conversely, for a stationary or relatively slow-moving object or background scene, the location values of the motion vectors are relatively small or equal to zero.

FIG. 5 illustrates the concept of motion vectors with reference to the non-I frame 1 and the reference frame 0 discussed above. A motion vector MV$_R$ indicates that a match for the macro block in the location R of frame 1 can be found in the location S of a reference frame 0. MV$_R$ has three components. The first component, here 0, indicates the frame (here frame 0) in which the matching macro block can be found. The next two components, X$_R$ and Y$_R$, together comprise the two-dimensional location value that indicates where in the frame 0 the matching macro block is located. Thus, in this example, because the location S of the frame 0 has the same X-Y coordinates as the location R in the frame 1, X$_R$=Y$_R$=0. Conversely, the macro block in the location T matches the macro block in the location Z, which has different X-Y coordinates than the location T. Therefore, $X_Z$ and $Y_Z$ represent the location T with respect to the location Z. For example, suppose that the location T is ten pixels to the left of (negative X direction) and seven pixels down from (negative Y direction) the location Z. Therefore, $MV_Z=(0, -10, -7)$. Although there are many other motion-vector schemes available, they are all based on the same general concept. For example, the locations R may be bidirectionally encoded. That is, the location R may have two motion vectors that point to respective matching locations in different frames, one preceding and the other succeeding the frame 1. During decoding, the pixel values of these matching locations are averaged or otherwise combined to calculate the pixel values of the location.

Referring again to FIG. 2, motion prediction is now discussed in detail. During the encoding of a non-I frame, a motion predictor 78 compares the pre-compression Y values—the $C_B$ and $C_R$ values are not used during motion prediction—of the macro blocks in the non-I frame to the decoded Y values of the respective macro blocks in the reference I frame and identifies matching macro blocks. For each macro block in the non-I frame for which a match is found in the I reference frame, the motion predictor 78 generates a motion vector that identifies the reference frame and the location of the matching macro block within the reference frame. Thus, as discussed below in conjunction with FIG. 6, during decoding of these motion-encoded macro blocks of the non-I frame, the decoder uses the motion vectors to obtain the pixel values of the motion-encoded macro blocks from the matching macro blocks in the reference frame. The prediction encoder 64 predictively encodes the motion vectors, and the coder 66 generates respective codes for the encoded motion vectors and provides these codes to the transmit buffer 68.

Furthermore, because a macro block in the non-I frame and a matching macro block in the reference I frame are often similar but not identical, the encoder 50 encodes these differences along with the motion vector so that the decoder can account for them. More specifically, the motion predictor 78 provides the decoded Y values of the matching macro block of the reference frame to the summer 54, which effectively subtracts, on a pixel-by-pixel basis, these Y values from the pre-compression Y values of the matching macro block of the non-I frame. These differences, which are called residuals, are arranged in 8×8 blocks and are processed by the DCT 56, the quantizer and scanner 58, the coder 66, and the buffer 68 in a manner similar to that discussed above, except that the quantized DC transform values of the residual blocks are coupled directly to the coder 66 via the line 60, and thus are not predictively encoded by the prediction encoder 64.

In addition, it is possible to use a non-I frame as a reference frame. When a non-I frame will be used as a reference frame, the quantized residuals from the quantizer and zigzag scanner 58 are respectively dequantized, reordered, and inverse transformed by the dequantizer and inverse scanner 70 and the inverse DCT 72, respectively, so that this non-I reference frame will be the same as the one used by the decoder for the reasons discussed above. The motion predictor 78 provides to the summer 74 the decoded Y values of the reference frame from which the residuals were generated. The summer 74 adds the respective residuals from the inverse DCT 72 to these decoded Y values of the reference frame to generate the respective Y values of the non-I reference frame. The reference-frame buffer 76 then stores the reference non-I frame along with the reference I frame for use in motion encoding subsequent non-I frames.

Although the circuits 58 and 70 are described as performing the zigzag and inverse zigzag scans, respectively, in other embodiments, another circuit may perform the zigzag scan and the inverse zigzag scan may be omitted. For example, the coder 66 can perform the zigzag scan and the circuit 58 can perform the quantization only. Because the zigzag scan is outside of the reference-frame loop, the dequantizer 70 can omit the inverse zigzag scan. This saves processing power and processing time.

Still referring to FIG. 2, the encoder 50 also includes a rate controller 80 to insure that the transmit buffer 68, which typically transmits the encoded frame data at a fixed rate, never overflows or empties, i.e., underflows. If either of these conditions occurs, errors may be introduced into the encoded data stream. For example, if the buffer 68 overflows, data from the coder 66 is lost. Thus, the rate controller 80 uses feed back to adjust the quantization scaling factors used by the quantizer/scanner 58 based on the degree of fullness of the transmit buffer 68. Specifically, the fuller the buffer 68, the larger the controller 80 makes the scale factors, and the fewer data bits the coder 66 generates. Conversely, the more empty the buffer 68, the smaller the controller 80 makes the scale factors, and the more data bits the coder 66 generates. This continuous adjustment insures that the buffer 68 neither overflows or underflows.

FIG. 6 is a block diagram of a conventional MPEG decompresser 82, which is commonly called a decoder and which can decode frames that are encoded by the encoder 50 of FIG. 2.

Referring to FIGS. 6 and 7, for I frames and macro blocks of non-I frames that are not motion predicted, a variable-length decoder 84 decodes the variable-length codes received from the encoder 50. A prediction decoder 86 decodes the predictively decoded DC transform values, and a dequantizer and inverse zigzag scanner 87, which is similar or identical to the dequantizer and inverse zigzag scanner 70 of FIG. 2, dequantizes and rearranges the decoded AC and DC transform values. Alternatively, another circuit such as the decoder 84 can perform the inverse zigzag scan. An inverse DCT 88, which is similar or identical to the inverse DCT 72 of FIG. 2, transforms the dequantized transform values into pixel values. For example, FIG. 7 is a block 89 of luminance inverse-transform values Y-IDCT, i.e., decoded luminance pixel values, which respectively correspond to the luminance transform values Y-DCT in the block 57 of FIG. 3 and to the pre-compression luminance pixel values $Y_a$ of the block 42a of FIG. 1B. But because of losses due to the quantization and dequantization respectively implemented by the encoder 50 (FIG. 2) and the decoder 82 (FIG. 6), the decoded pixel values in the block 89 are often different than the respective pixel values in the block 42a.

Still referring to FIG. 6, the decoded pixel values from the inverse DCT 88 pass through a summer 90—which is used during the decoding of motion-predicted macro blocks of non-I frames as discussed below—into a frame-reorder buffer 92, which stores the decoded frames and arranges them in a proper order for display on a video display unit 94. If a decoded frame is used as a reference frame, it is also stored in the reference-frame buffer 96.

For motion-predicted macro blocks of non-I frames, the decoder 84, dequantizer and inverse scanner 87, and inverse DCT 88 process the residual transform values as discussed above for the transform values of the I frames. The prediction decoder 86 decodes the motion vectors, and a motion interpolator 98 provides to the summer 90 the pixel values from the reference-frame macro blocks to which the motion vectors point. The summer 90 adds these reference pixel values to the residual pixel values to generate the pixel values of the decoded macro blocks, and provides these decoded pixel values to the frame-reorder buffer 92. If the encoder 50 (FIG. 2) uses a decoded non-I frame as a reference frame, then this decoded non-I frame is stored in the reference-frame buffer 96.

Referring to FIGS. 2 and 6, although described as including multiple functional circuit blocks, the encoder 50 and the decoder 82 may be implemented in hardware, software, or a combination of both. For example, the encoder 50 and the decoder 82 are often implemented by a respective one or more processors that perform the respective functions of the circuit blocks.

More detailed discussions of the MPEG encoder 50 and the MPEG decoder 82 of FIGS. 2 and 6, respectively, and of the MPEG standard in general are available in many publications including "Video Compression Demystified" by Peter D. Symes, McGraw-Hill, 2001, which is incorporated by reference. Furthermore, there are other well-known block-based compression techniques for encoding and decoding both video and still images.

DC Prediction in MPEG-4

Referring to FIG. 8, as discussed above, a macro block 100 typically includes four 8×8 luminance blocks 102A–102D. The macro block 100 also includes two or more 8×8 chrominance blocks that are omitted for clarity. Each macro block 100 is either an intra (I) or inter (P) macro block. An I macro block is not encoded/decoded using motion prediction, but may have coefficients that are DC/AC predicted with respect to another macroblock. Conversely, a P macroblock block is motion predicted. A P frame can have I macro blocks within it, but an I frame has no P macro blocks within it.

The first coefficient of each block 102A–102D is a DC (zero frequency) coefficient, and the next 63 coefficients are AC (non-zero frequency) coefficients. For example, the first coefficient $DC_A$ of the block 102A is a DC coefficient.

To compress the encoded bit stream that represents the frame including the macroblock 100, the DC coefficients of all I macro blocks (except the three upper-left-hand 8×8 blocks of the upper-left-hand macro block (not shown) of the frame) are prediction encoded. That is, each of the DC coefficients, such as $DC_A$, of an I macro block is encoded as a residual value that equals the difference between the DC coefficient and either the DC coefficient from the block to the left or from the block to the top. For example, $DC_{A'}$, which is the residual for $DC_A$, equals $(DC_A-DC_B)//QP_{102A}$ (vertical prediction) or $(DC_A-DC_C)//QP_{102A}$ (horizontal prediction), where $QP_{102A}$ is the quantization factor for the block 102A.

The // operator is a special rounding-division operator defined by the MPEG-4 standard. Basically, if $DC_B \div QP_{103B}$ is positive, the // operator rounds the result to the nearest integer value. For example if $DC_B=13$ and $QP_{103B}=3$, then $13 \div 3 = 4.333$ and $13//3=4$. If the result of $DC_B \div QP_{103B}$ had been 4.5 or greater, the // operator would have rounded the result up to 5. For negative numbers, the // operator rounds any number between and including −4.0 to −4.5 up to −4, and rounds any number less than −4.5 and greater than or equal to −5.0 down to −5.

Prediction-Direction Calculation for DC And AC Prediction in MPEG-4

Referring to FIG. 8, one determines the DC/AC prediction direction for an 8×8 block, such as the block 102A, of an I macro block, such as the macro block 100, according to the following equation:

$$\text{IF } |DC_C - DC_D| \leq |DC_D - DC_B| \quad (1)$$

THEN vertical DC/AC prediction,

ELSE, horizontal DC/AC prediction

The quantized value is decided by $2^{(bits\_per\_pixel+2)}$ where bits_per_pixel is 8 in most cases.

The MPEG-4 standard states that for purposes of determining the prediction-direction according to equation (1), a block 103A, 103B, or 103C that belongs to a P macro block is assumed to have a DC coefficient equal to the maximum quantized value of $2^{(bits}\_per\_pixel+2)$. If the predicted block is in a P macroblock, its DC value does not matter (because it is not I-macroblock.). For example, if the block 103B belongs to a P macro block, then for purposes of equation (1) where bits-per-pixel=108, $DC_B=2^{10}=2048$ even if in actuality $DC_B$ has another value. The same assumption is made for $DC_C$ and $DC_D$, respectively, if blocks 103C and 103A belong to respective P macroblocks.

BRIEF DESCRIPTION OF THE DRAWINGS

FIG. 3 is a block diagram of luminance transform values that are generated by the encoder of FIG. 2 and that respectively correspond to the pre-compression luminance pixel values of FIG. 1B.

FIG. 7 is a block of inverse transform values that are generated by the decoder of FIG. 6 and that respectively correspond to the luminance transform values of FIG. 3 and the pre-compression luminance pixel values of FIG. 1B.

FIGS. 9A–9D are diagrams showing situations where vertical and horizontal prediction in MPEG-4 is evident without calculation.

SUMMARY OF THE INVENTION

In one embodiment of the invention calculation of the prediction-direction equation is avoided where the macro blocks used for prediction are of certain types.

DESCRIPTION OF THE INVENTION

Determining the Prediction Direction

As discussed above, referring to FIG. 8 and 22, one determines the prediction direction according to the following:

$$\text{IF } |DC_C-DC_D| \leq |DC_D-DC_B| \tag{1}$$

THEN vertical DC/AC prediction,
ELSE, horizontal DC/AC prediction

Figure 8:
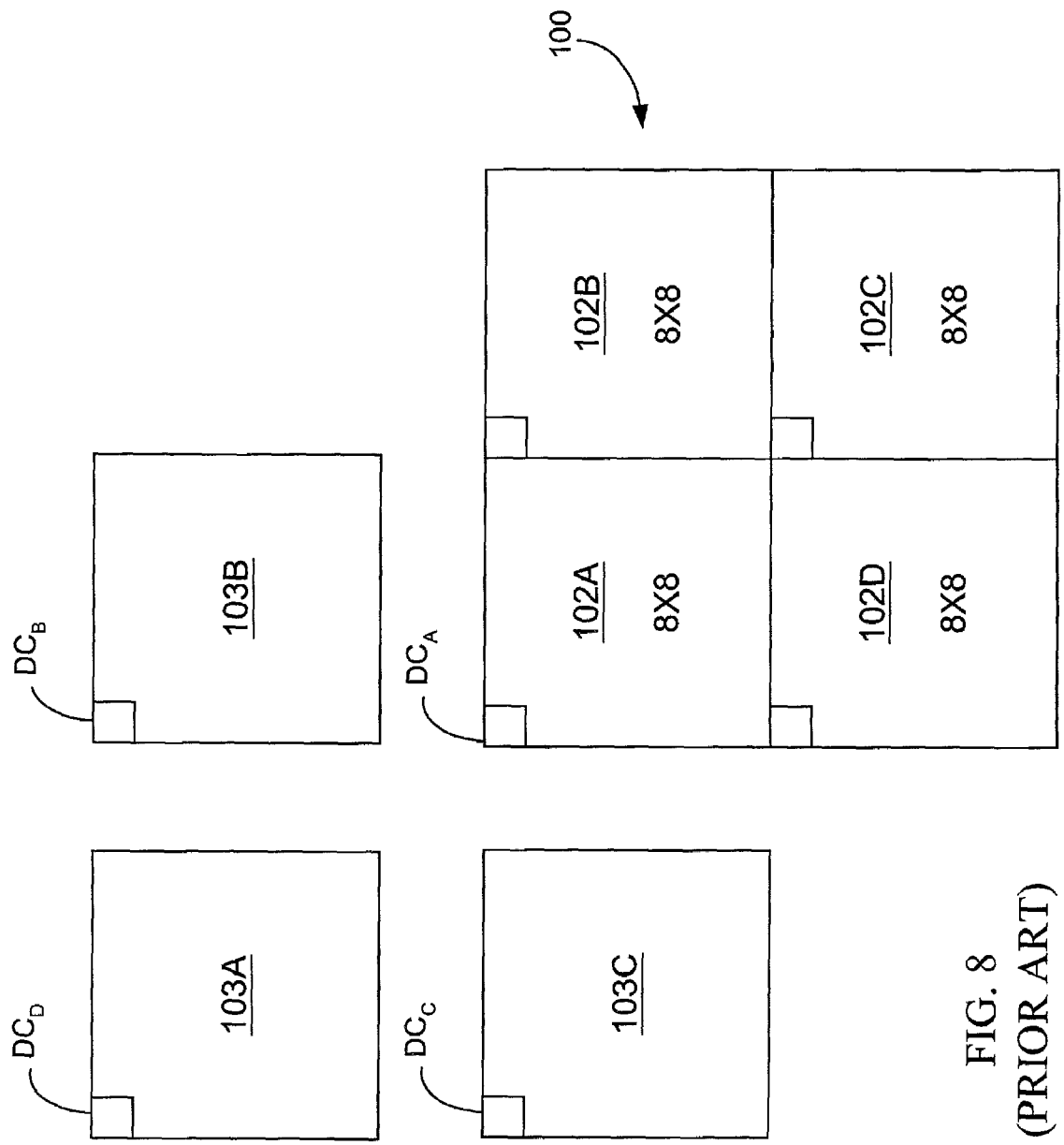
FIG. 8 is a diagram of a macro block showing DC coefficient prediction possibilities.
Figure 9D:
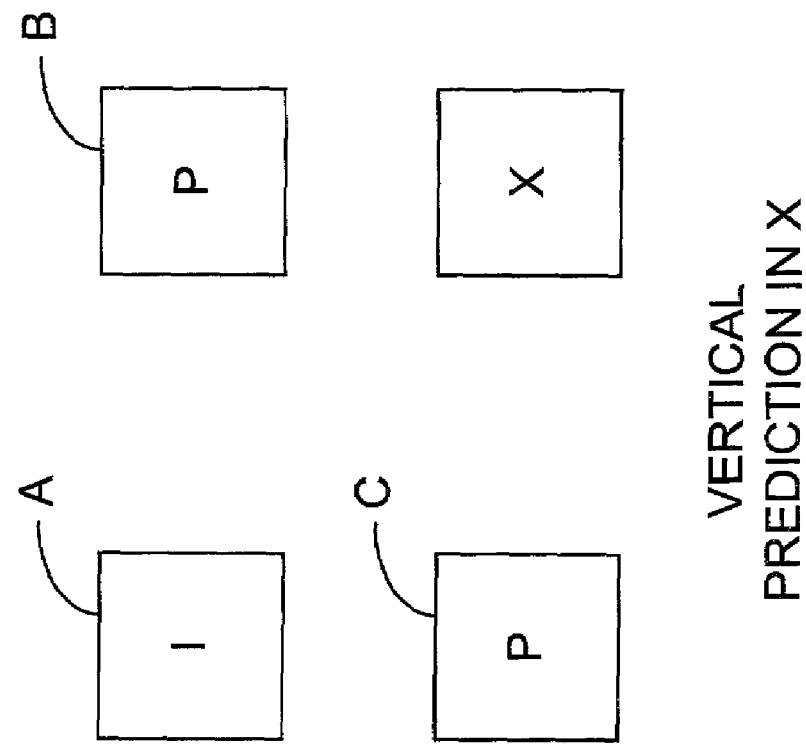
Figure 9C:
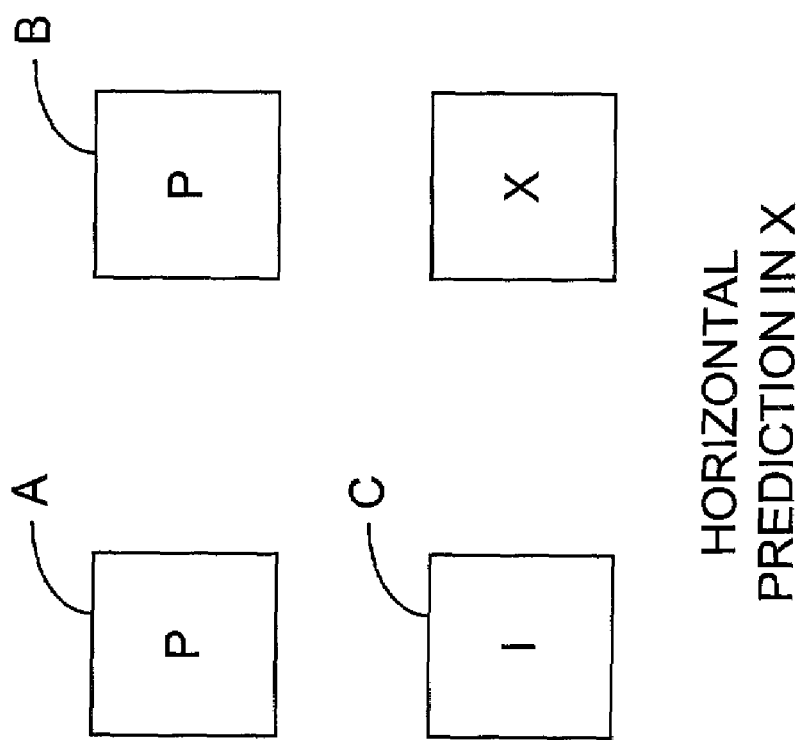

Referring to FIG. 8, the MPEG-4 standard states that for DC prediction purposes, if a block 103A, 103B, or 103C is a P block, then assume that the respective DC coefficient value, $DC_B$, $DC_C$, or $DC_D$, equals the maximum DC value of 2048.

Therefore, referring to FIGS. 9A–9D, there are four situations where the prediction direction is evident without calculating equation (1). For example, if all the blocks A, B, and C are P blocks as in FIG. 9A, then $|DC_C-DC_D|=|2048-2048|=|DC_{D-DCB}|=|2048-2048|$. Because the IF clause of equation (1) is true, vertical prediction is used. If blocks A and C are P blocks and block B is an I block as in FIG. 9B, then $|DC_C-DC_D|=|2048-2048|=0$, which is $\leq |DC_{D-DCB}|=|2048-DC_B|$, because the maximum value of $DC_B$ is 2048. Because the IF clause of equation (1) is true, vertical DC/AC prediction is used. If blocks A and B are P blocks and block C is an I block as in FIG. 9C, then $|DC_C-DC_D|=|DC_C-2048|\geq 0$, $|DC_D-DC_B|=|2048-2048|=0$, so the IF clause is only true if $DC_C=2048$. Because this is highly unlikely, we can assume that $|DC_C-2048|>0$, and thus assume that the IF clause of equation (1) is always false so that horizontal prediction is used. Finally, if block A is an I block and blocks B and C are P blocks, then $|DC_C-DC_D|=|2048-DC_D|=|DC_D-DC_B|=|DC_D-2048|$. Because the IF clause of equation (1) is always true, vertical prediction is used.

To summarize:
(a) If A=B=C=P block, use vertical prediction.
(b) If A=C=P block and B=I block, use vertical prediction.
(c) If A=B=P block and C=I block, use horizontal prediction.
(d) If A=I block and B=C=P block, use vertical prediction.

An even simpler equation is:

$$\text{IF (C=P block) AND (A OR B=P block),} \tag{2}$$

THEN vertical prediction
ELSE

IF (C=I block) AND (A AND B=P block), then horizontal prediction
ELSE implement equation (1) to determine prediction direction One embodiment of the invention is using equation (2) to eliminate implementation of equation (1) when possible. This is an improvement on the MPEG-4 standard, which calls for calculating equation (1) for each block X (FIGS. 9A–9D). Not calculating equation (1) is more efficient, particularly when using the Equator MAP 1000 processor, which is discussed in U.S. patent application No. 60/690,048 which is incorporated by references. This is because the MAP 1000 carries out AC and DC prediction in the VLX side of the processor, but calculates equation (1) in the core side of the processor. It is more efficient if the prediction-related calculations are not split between the two sides of the processor. Specifically, it is more efficient if all of the prediction-related processing is done in the VLX side of the processor. Therefore, where the VLX side can determine the prediction direction using (a)–(d) above (i.e., without calculating equation (1)), then it does so and performs the prediction for a block in the determined direction. Otherwise, the VLX assumes that vertical prediction is appropriate and thus does the prediction in a vertical direction. That is, the VLX determines the prediction direction according to a modified equation (2):

$$\text{IF (C=I block) AND (A AND B=P block),} \tag{3}$$

then horizontal prediction
ELSE, vertical prediction

Equation (3) is accurate most of the time, since vertical prediction is more likely than horizontal direction per (a)–(d) above. But equation (3) sometimes incorrectly yields vertical prediction when horizontal prediction should be used.

Figures 1A, 1B:
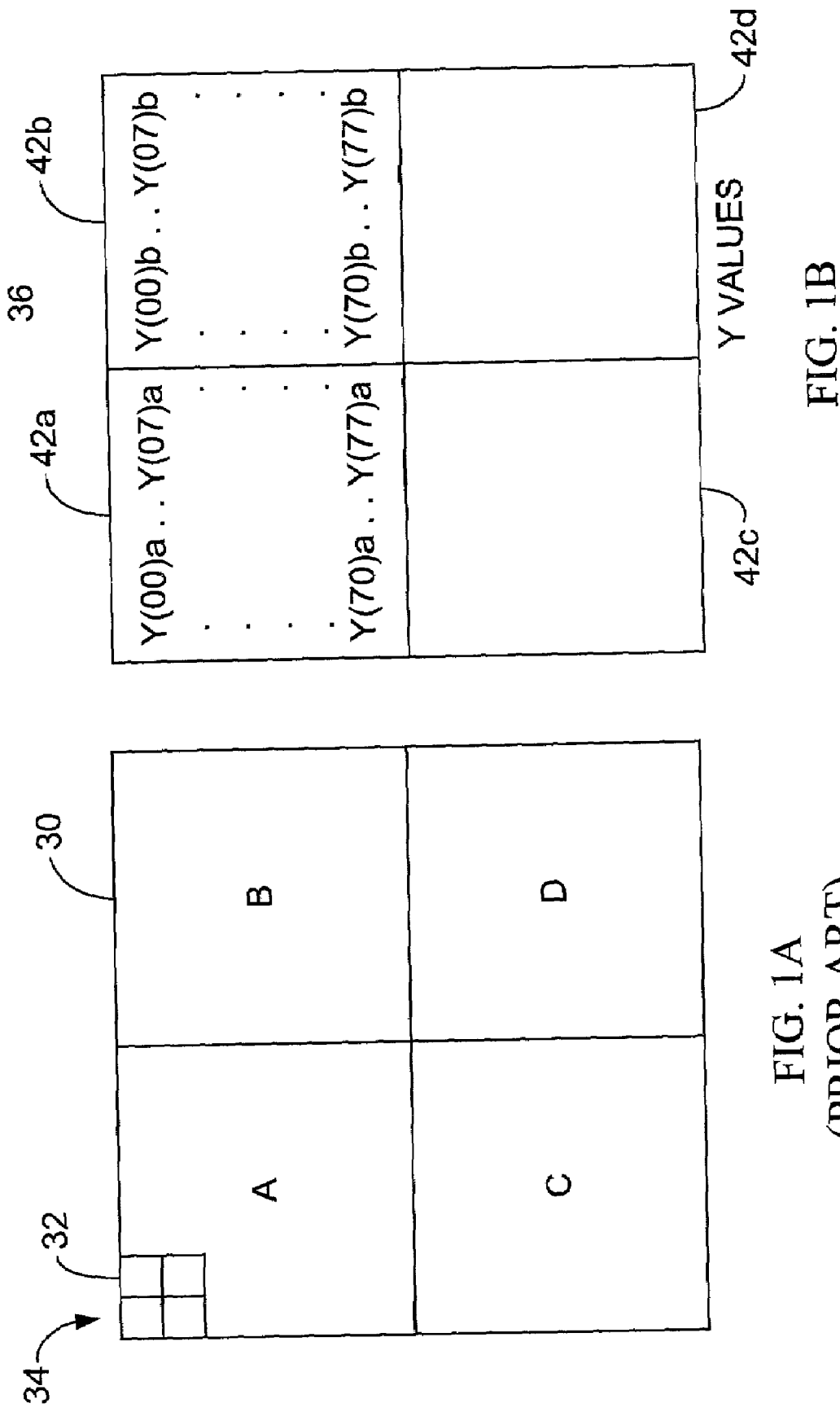
FIG. 1A is a diagram of a conventional macro block of pixels in an image.
FIG. 1B is a diagram of a conventional block of pre-compression luminance values that respectively correspond to the pixels in the macro block of FIG. 1A.
Figures 1C, 1D:
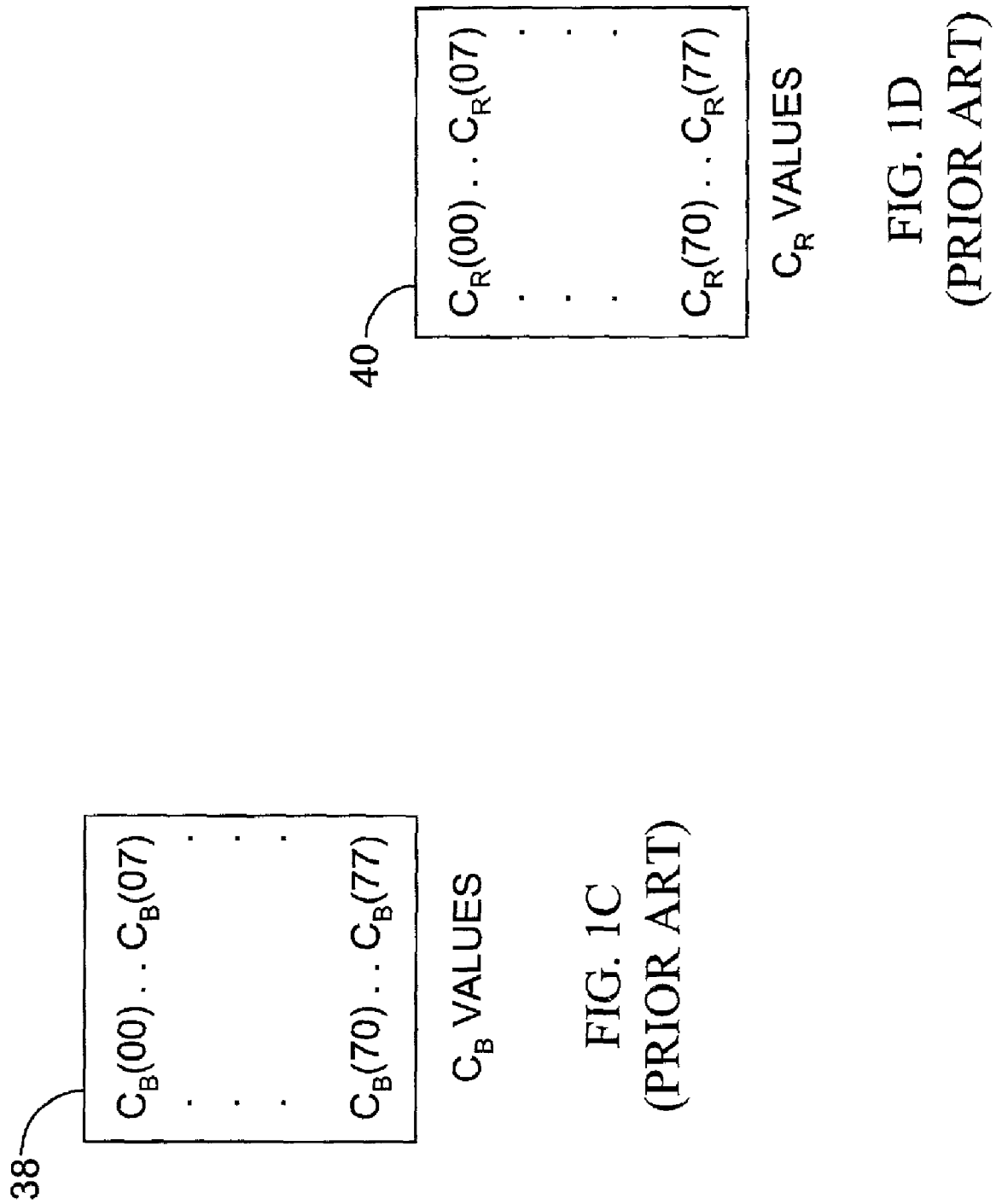
FIGS. 1C and 1D are diagrams of conventional blocks of pre-compression chroma values that respectively correspond to the pixel groups in the macro block of FIG. 1A.
Figure 2:
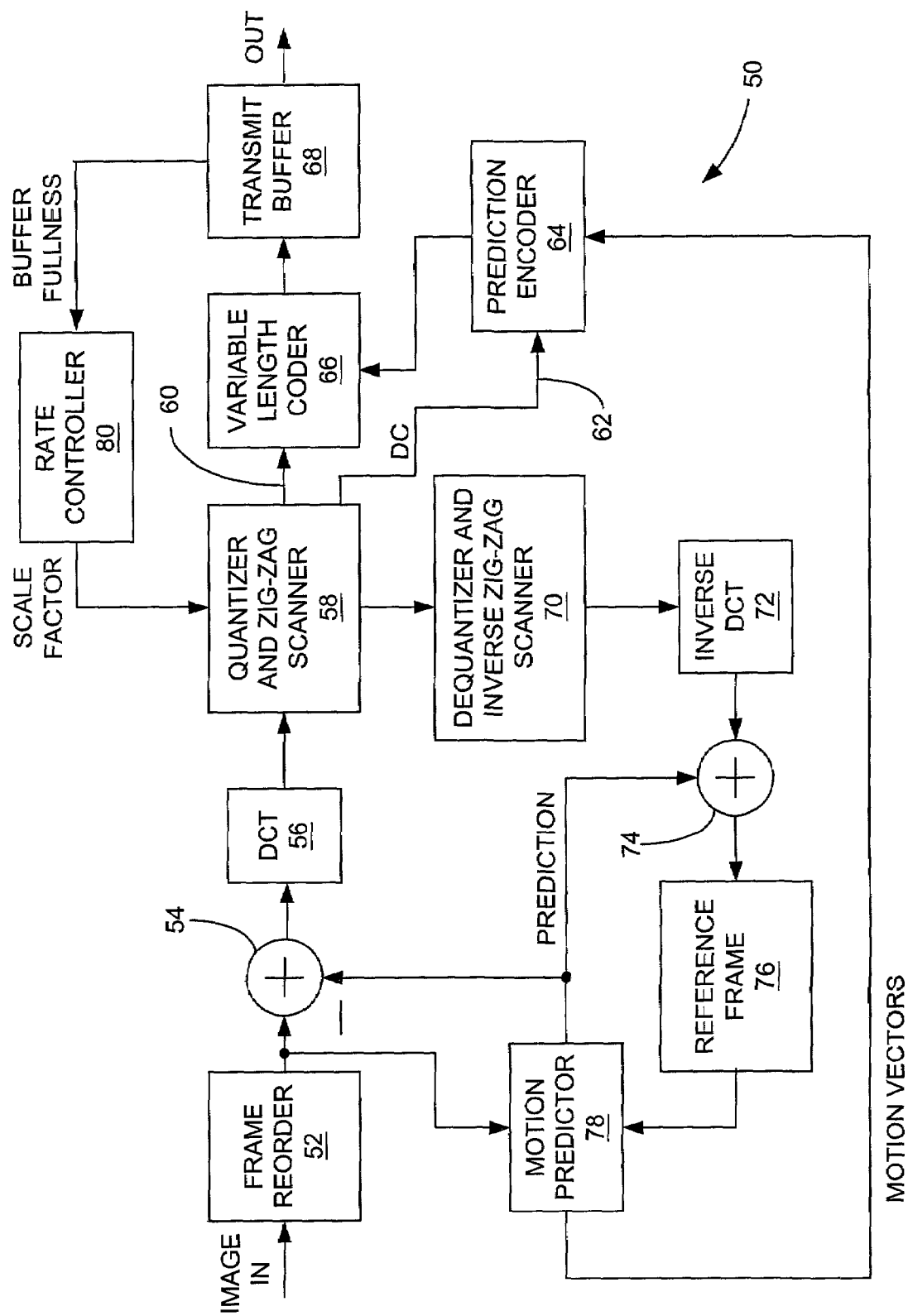
FIG. 2 is a block diagram of a conventional MPEG encoder.
Figure 4:
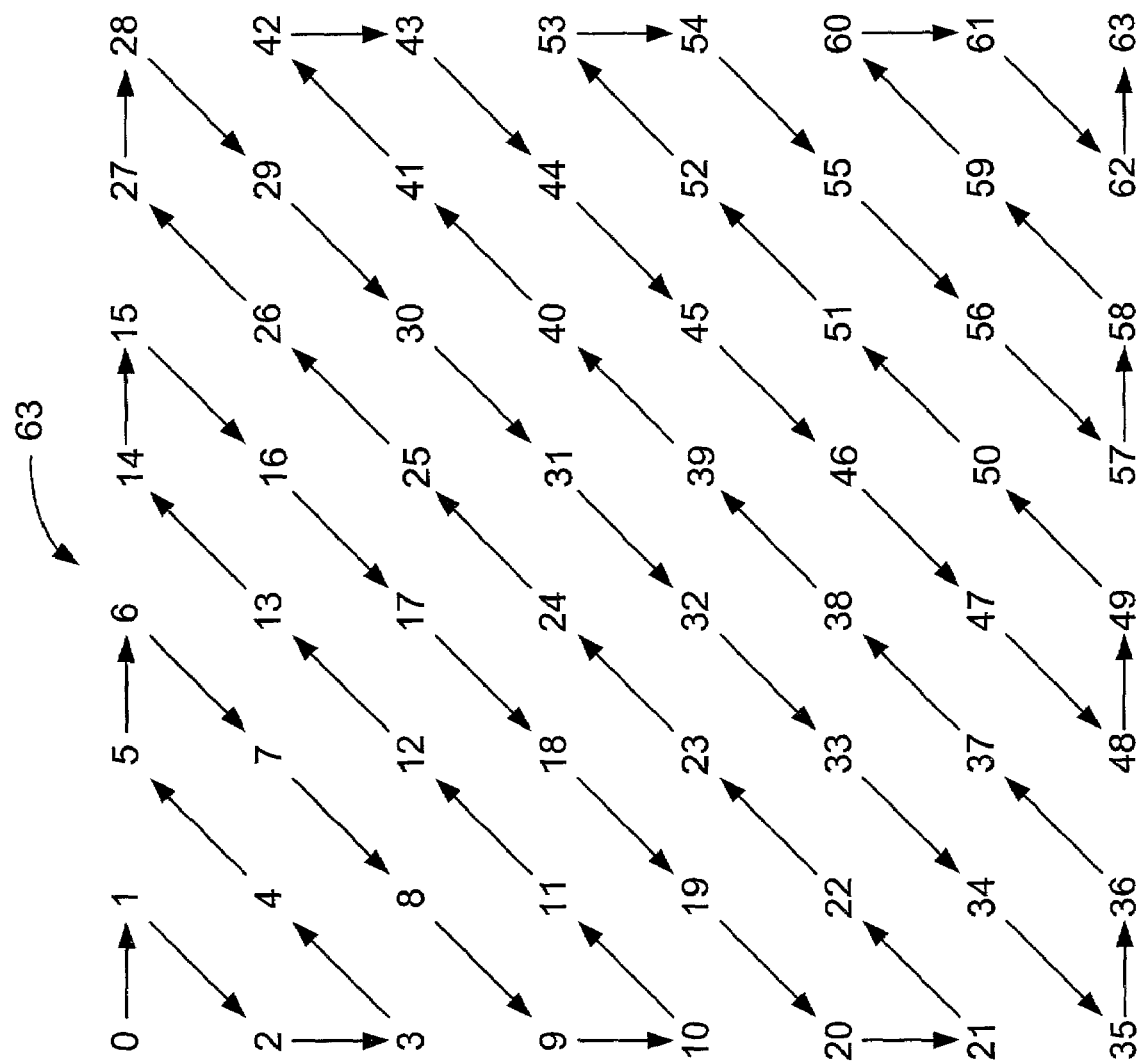
FIG. 4 is a conventional zigzag sampling pattern that can be implemented by the quantizer and zigzag scanner of FIG. 2.
Figure 5:
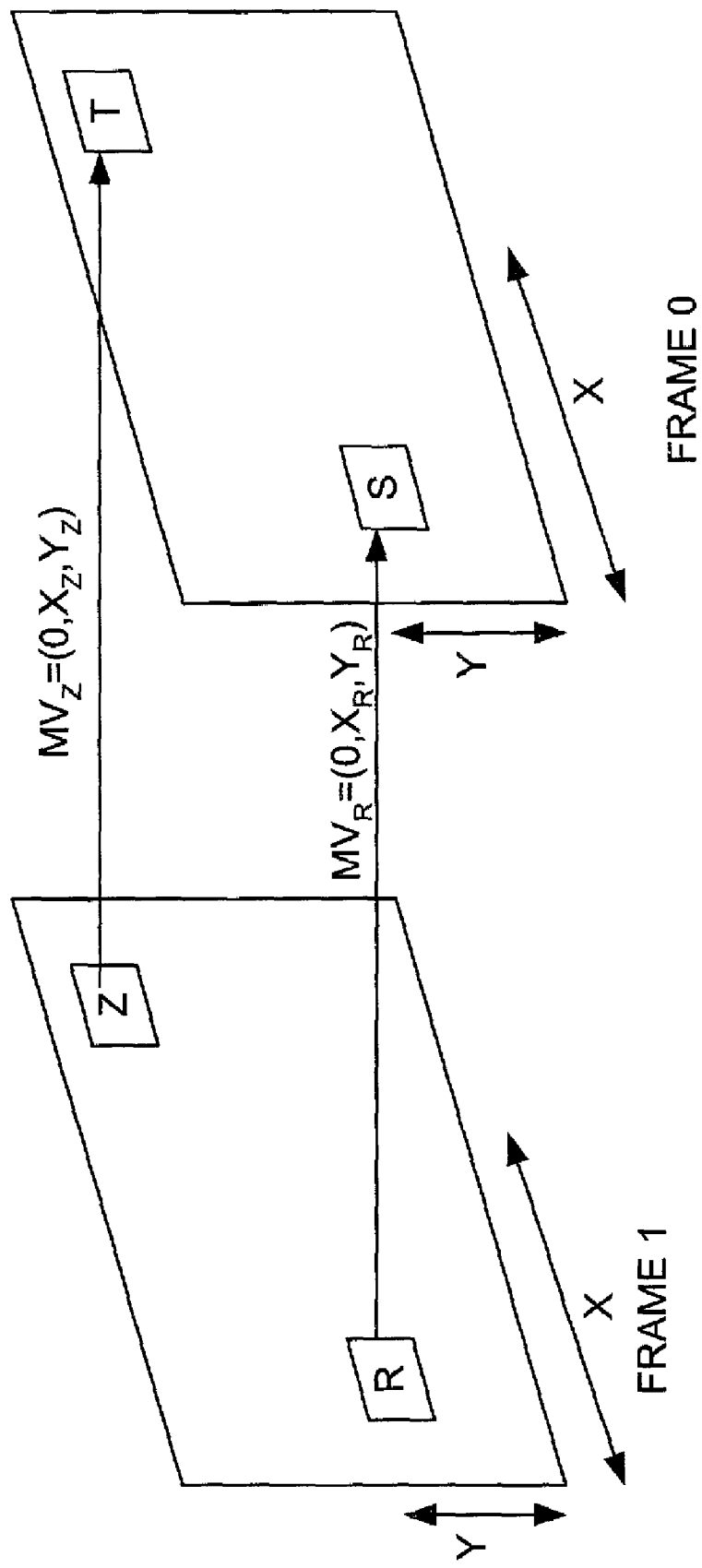
FIG. 5 illustrates the concept of conventional motion vectors.
Figure 6:
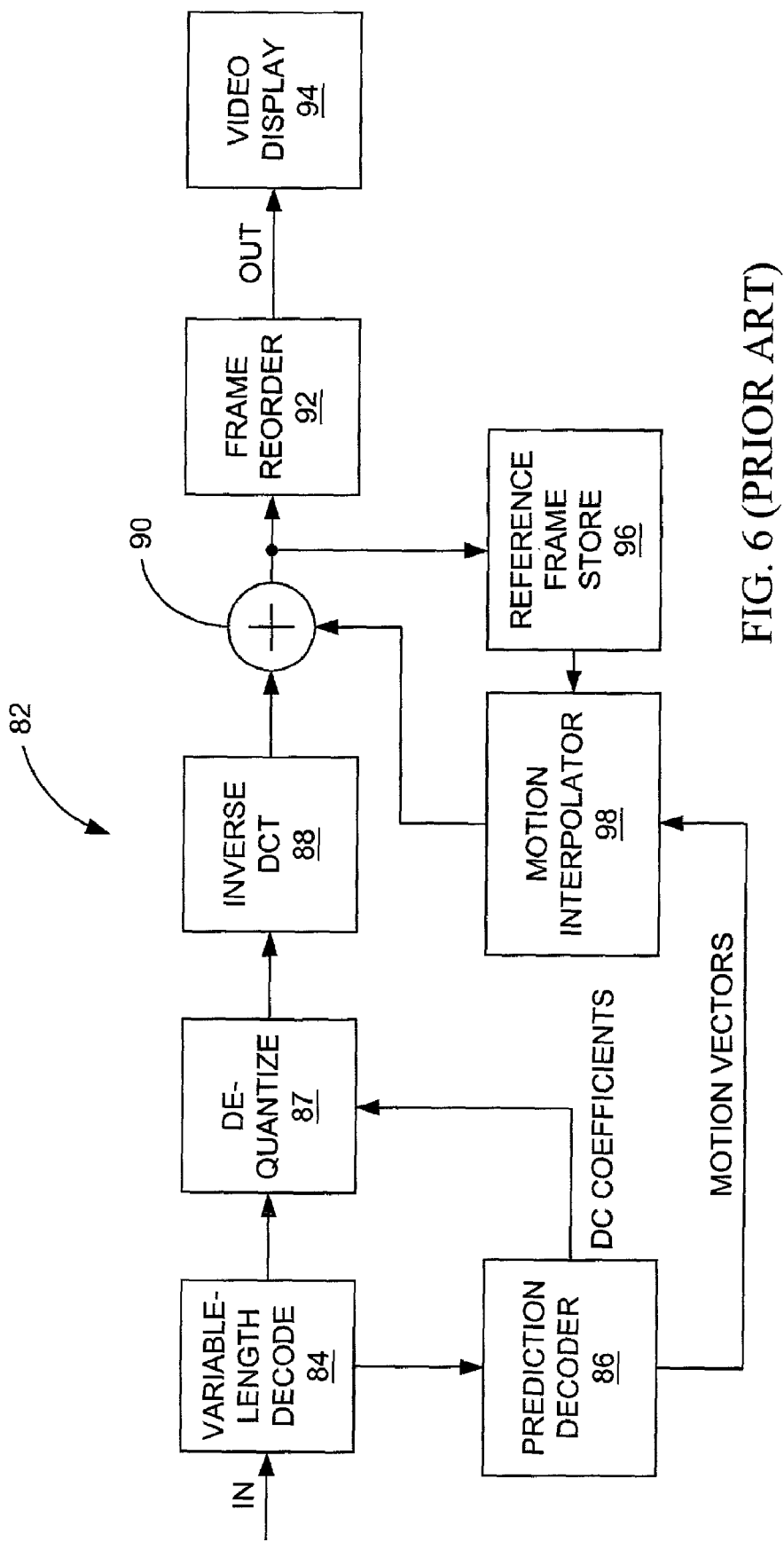
FIG. 6 is a block diagram of a conventional MPEG decoder.

Because the MAP processor is designed to perform operations on a row-by-row basis as opposed to a column-by-column basis, if the MAP processor uses vertical prediction when it should have used horizontal prediction, then the MAP stores the block being decoded stored in a transposed manner. More specifically, the prediction direction also dictates in which way the block was scanned into the encoded bit stream. That is, for vertical prediction, the block has been scanned into memory and put out on the bit stream in a zigzag pattern like the one discussed above in conjunction with FIG. 4. However, for horizontal prediction, the block has been scanned into memory in a different pattern, for example starting a zigzag scan at the lower-left-hand corner of the block instead of the upper-left-hand corner. Therefore, when the MAP uses vertical prediction when it should have used horizontal prediction, even though the correct prediction block is used (the block to the left of the block being decoded, not the block on top as with true vertical prediction), the resulting decoded block is stored in a transposed manner. That is, if the decoded block is scanned out according to a vertical scan pattern, the pixels within the block will appear on the display screen in a transposed manner. One solution is to use the core side of the MAP to transpose the block into proper pixel alignment. But because most motion pans horizontally from left-to-right/right-to-left, not vertically, the vast majority of predictions are vertical. Therefore, for the few blocks encoded using horizontal prediction, one can merely leave such a block in an improper alignment. Because these improperly decoded blocks are few and far between, they minimally degrade the decoded image.

The few blocks encoded using horizontal prediction are improperly aligned because if the prediction direction is vertical, a scanning method called 'alternative horizontal scanning' is used. If the prediction direction is horizontal, a different scanning method called 'alternative vertical scanning' is used. One scanning method is a transpose of the other. The column data of a block can be 'column' or 'row' data depending on the scanning method.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims. For example, processors other than the Equator MAP 1000 can implement this technique for determining the direction of DC prediction. Also, this technique can be used for determining the direction of AC prediction.

The invention claimed is:

1. A video processing circuit comprising:
a processor operable to
receive an encoded image including a plurality of blocks each being of a respective type and having a zero-frequency transform coefficient, at least one of the blocks being of an intraframe type;

if the blocks are arranged in a first predetermined pattern of block types, select, for a macro block including the blocks, a transform prediction direction corresponding to the predetermined pattern; and if the blocks are arranged in a second predetermined pattern of block types, calculate the transform prediction direction from the zero-frequency transform coefficients of the blocks;

wherein selecting the transform prediction direction comprises selecting the prediction direction to be vertical where the blocks above, horizontally left, and diagonal are all predicted frame blocks.

2. A video processing circuit comprising:

a processor operable to receive an encoded image including a plurality of blocks each being of a respective type and having a zero-frequency transform coefficient, at least one of the blocks being of an intraframe type;

if the blocks are arranged in a first predetermined pattern of block types, select, for a macro block including the blocks, a transform prediction direction corresponding to the predetermined pattern; and if the blocks are arranged in a second predetermined pattern of block types, calculate the transform prediction direction from the zero-frequency transform coefficients of the blocks;

wherein selecting the transform prediction direction comprises selecting the prediction to be vertical where the blocks diagonally left and horizontally left are predicted frame blocks and the block above is an intraframe block.

3. A video processing circuit comprising:

a processor operable to receive an encoded image including a plurality of blocks each being of a respective type and having a zero-frequency transform coefficient at least one of the blocks being of an intraframe type;

if the blocks are arranged in a first predetermined pattern of block types, select, for a macro block including the blocks, a transform prediction direction corresponding to the predetermined pattern; and if the blocks are arranged in a second predetermined pattern of block types, calculate the transform prediction direction from the zero-frequency transform coefficients of the blocks;

wherein selecting the transform prediction direction comprises selecting a DC block prediction direction to be horizontal where the blocks diagonally left and the above are both predicted frame blocks and the block horizontally left is an intraframe block.

4. A video processing circuit comprising:

a processor operable to receive an encoded image including a plurality of blocks each being of a respective type and having a zero-frequency transform coefficient, at least one of the blocks being of an intraframe type;

if the blocks are arranged in a first predetermined pattern of block types, select, for a macro block including the blocks, a transform prediction direction corresponding to the predetermined pattern; and if the blocks are arranged in a second predetermined pattern of block types, calculate the transform prediction direction from the zero-frequency transform coefficients of the blocks;

wherein selecting the transform prediction direction comprises selecting the prediction to be vertical where the block diagonally left is an intraframe block and the blocks above and horizontally left are both predicted frame blocks.

5. A The video processing circuit comprising:

a processor operable to receive an encoded image including a plurality of blocks each being of a respective type and having a zero-frequency transform coefficient, at least one of the blocks being of an intraframe type;

if the blocks are arranged in a first predetermined pattern of block types, select, for a macro block including the blocks, a transform prediction direction corresponding to the predetermined pattern; and if the blocks are arranged in a second predetermined pattern of block types, calculate the transform prediction direction from the zero-frequency transform coefficients of the blocks;

wherein selecting the transform prediction direction comprises selecting the prediction direction to be vertical where the block horizontally left is a predicted frame block and either the block diagonally left or the block above is a predicted frame macro.

6. A video processing circuit comprising:

a processor operable to receive encoded images including a plurality of blocks;

select, for a macro block including the blocks, a DC transform prediction direction by:

selecting the DC prediction direction to be vertical under a first condition wherein the block horizontally left is a predicted frame block and either the block diagonally left or the block above is a predicted frame block;

selecting the DC prediction direction to be vertical under a second condition wherein the block horizontally left is an intraframe block and the blocks diagonally left and above are predicted frame blocks; and under a third condition different from the first and second conditions, calculating the DC prediction direction from the values of DC transform coefficients of the blocks.

7. A method comprising:

selecting, for a macro block including a plurality of blocks, a transform prediction direction to be horizontal under a first condition wherein the block horizontally left is an intraframe block and the blocks diagonally left and above are predicted frame blocks; and under a second condition different from the first condition, selecting the transform prediction direction to be vertical.

8. A method comprising:

selecting, for a macro block including a plurality of blocks, a transform prediction direction to be horizontal under a first condition wherein the block horizontally left is an intraframe block and the blocks diagonally left and above are predicted frame blocks;

under a second condition, selecting the transform prediction direction and to be vertical; and transposing a decoded block under a third condition wherein vertical prediction was erroneously selected instead of horizontal prediction.

9. The method of claim 8 wherein selecting the transform prediction direction comprises foregoing calculation of the equation set forth in the MPEG-4 standard to determine the block prediction direction.

* * * * *